United States Patent [19]

Rivoir

[11] 4,208,628

[45] Jun. 17, 1980

[54] MEASURING MECHANISM HAVING A POSITIVE LOCKING ARRANGMENT FOR WIDE-ANGLE MOVING COIL SYSTEMS AND METHOD FOR ITS ASSEMBLY

[76] Inventor: Karl H. Rivoir, Am Nagoldhang 5, 7530 Pforzheim, Fed. Rep. of Germany

[21] Appl. No.: 838,395

[22] Filed: Sep. 30, 1977

[30] Foreign Application Priority Data

Oct. 6, 1976 [DE] Fed. Rep. of Germany ....... 2645068

[51] Int. Cl.² .............................................. G01R 5/08
[52] U.S. Cl. .................................................... 324/150
[58] Field of Search ............... 324/150, 151 R, 151 A; 335/222, 224

[56] References Cited

U.S. PATENT DOCUMENTS

| 2,848,662 | 8/1958 | Barry et al. ...................... 324/150 X |
| 3,237,103 | 2/1966 | Kunz et al. ........................... 324/150 |
| 3,378,768 | 4/1968 | Hautmann ........................... 324/150 |
| 3,962,633 | 6/1976 | Nadeau ................................ 324/150 |

FOREIGN PATENT DOCUMENTS 937479  1/1956  Fed. Rep. of Germany ........... 324/150

*Primary Examiner*—Gerard R. Strecker
*Attorney, Agent, or Firm*—Toren, McGeady and Stanger

[57] ABSTRACT

A measuring mechanism for a wide-angle moving coil measuring system and a method for its assembly are disclosed. The mechanism includes concentrically arranged inner and outer pole rings. The rings terminate in arms between which a slot or spacing is arranged. The spacing is accessible from outside the mechanism in which spacing a pre-assembled movable part having an axle or two axle-hubs and moving coil frame is inserted into the internal space of the inner pole ring. The magnets are arranged to positive-locked with the pole rings. Two arrangements of magnets cooperating with the pole rings are disclosed.

16 Claims, 4 Drawing Figures

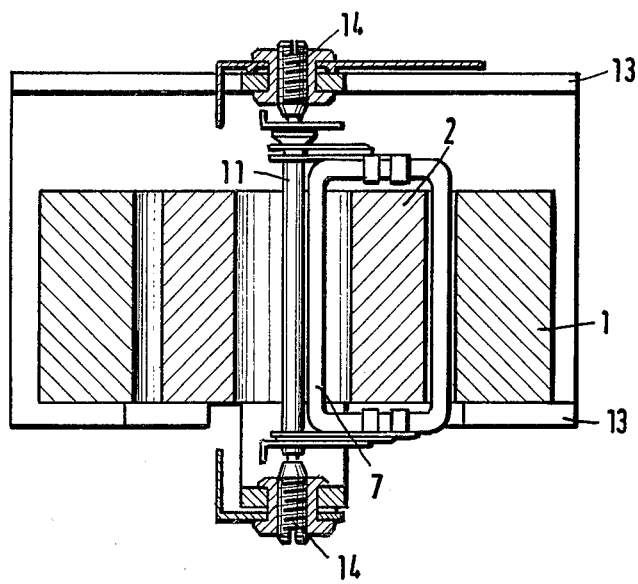
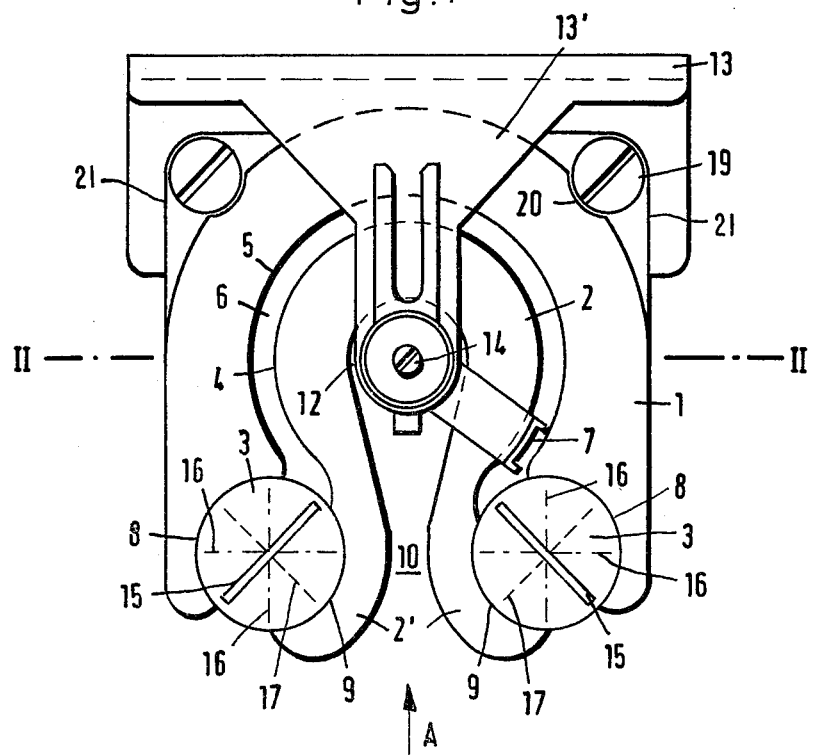

MEASURING MECHANISM HAVING A POSITIVE LOCKING ARRANGMENT FOR WIDE-ANGLE MOVING COIL SYSTEMS AND METHOD FOR ITS ASSEMBLY

BACKGROUND OF THE INVENTION

1. Field of the Invention

The invention relates to a measuring mechanism for wide-angle moving coil systems, consisting of a mount with a movable part, an inner and an outer pole ring and one or two magnets. The invention relates further to a method for assembling the parts.

2. Background of the Prior Art

With known measuring mechanisms of the initially described type, the movable part of the measuring mechanism can be mounted and balanced only inside the magnetic system. These operations, however, are a very great waste of time and impose a great burden on assembly personnel. Because of the simultaneous incorporation of heavy and highly sensitive parts in a single operating step, a further potential danger is that of damaging sensitive measuring mechanism pivots and bearings. To mechanize and/or economize on these operations is practically impossible.

A further drawback of these known measuring mechanisms is that the pole rings and magnets have to be screwed or bonded together in an expensive way. Because it is very expensive to insert bores or the like into permanent magnets, the screw coupling is extremely expensive.

A further difficult requirement is that the parts need to be arranged concentrically and for this purpose require adjustment. This operating stage is necessary because otherwise the scalar linearity of the measuring mechanism cannot be guaranteed. A mutual bonding of the parts requires considerably complex apparatus. Despite this complexity, however, usually the desired degree of concentricity is not reached and, further, cannot be corrected, which has detrimental effects. The above noted costs of final assembly of the measuring mechanism and its final adjustment must also be considered.

An object of the invention then is to provide a measuring mechanism for wide-angle moving coil systems, where together with an extensive reduction in production and assembly costs, the required concentricity of magnetic system components and, accordingly, the desired linearity of measuring mechanism readouts can be accomplished. Specific fabrication aims are a simplification of laborious assembly operations and avoidance of adjusting operations. These problems arise for the above noted wide-angle moving coil systems, where the pointer, and therewith the moving coil frame, must sweep a wide angle e.g., of 250°. In this case, the discussed problems of concentricity and linearity are substantially more difficult to manage than with so-called 90°-instruments, i.e., where moving coil frame and pointer sweeper only a 90°-angle, and where part of the negative eccentricity effects produced on instrument linearity are cancelled. This is so because the coil at diametrically opposed positions dips twice into the magnetic field. But with so-called 250° or wide-angle systems—in contrast with 90°-systems—there is no compensation for momentary deviation effective at both coil sides.

SUMMARY OF THE INVENTION

In accordance with the invention, which is intended to solve the above described difficulties, a measuring mechanism for a wide angle moving coil system comprises a mount with movable part, an inner and outer pole ring and at least one magnet. The mechanism has a mutually positive-locking arrangement of magnet and pole rings. The pole rings are mutually centered and fixed in this position. Each of the pole rings has two arms, between which a slot or spacing is arranged. The movable part has an axle or two axle-stubs and a moving coil frame. For holding the axle or at least one element of the movable part and part of its moving coil frame, an internal spacing of inner pole ring is arranged, which spacing is accessible from outside of the mechanism. The slot has a width which is dimensioned so that a pre-assembled mount with at least one element and corresponding coil frame can be inserted into the internal space of the inner pole ring.

For a better understanding of the present invention, reference is made to the attached drawings and the following detailed description, while the scope of the invention will be pointed out in the appended claims.

DESCRIPTION OF THE DRAWINGS

In the drawings:

FIG. 1 shows a plan view of a measuring mechanism according to the invention.

FIG. 2 is a sectional view taken along line II—II of FIG. 1.

DETAILED DESCRIPTION OF THE INVENTION

Figure 4:
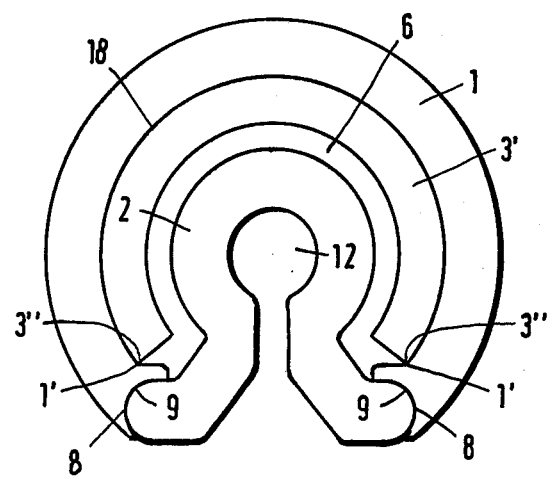
FIG. 4 is a plan view of another embodiment of a magnetic system according to the invention without mount and moving part.

Referring initially to FIGS. 1 and 2, the magnetic system of the measuring mechanism consists of outer pole ring 1, inner pole ring 2 and magnets, which in the embodiment of FIG. 1 are shown to be two cylindrical permanent magnets. Magnets and pole rings can be parts of a simple extruded or sintered type, which may be manufactured to a very accurate shape.

The positive-locking development of these parts and mutual arrangement thereof insures that the pole rings 1, 2 are exactly mutually centered and, in this position, are fixed in any direction of the plane of projection shown in FIG. 1.

In the FIG. 1 embodiment, both pole rings are developed as part of a cylinder ring. Between the outer circumference 4 of inner pole ring 2 and the inner circumference 5 of outer pole ring 1, a cylindrical air gap 6 is located for the pickup and rotation of moving coil frame 7. The concentricity of pole rings 1,2 to each other and their fixed arrangement in each direction of the plane of projection of FIG. 1 (and the concentric run of air gap 6 and consequently produced homogeneity of the magnetic field in said air gap) are insured by outer pole ring centering surfaces 8 and inner pole ring centering surfaces 9. These surfaces are located at the ends or arms of the pole rings and so interact.

In this embodiment, the positive-lock centering takes place via both interpolated magnets 3. Magnets 3 are so shaped and dimensioned that their outer areas are positive-locked to centering surfaces 8, 9. The centering surfaces 8, 9 and the magnets are developed cylindrically and/or as cylindrical surfaces. Arms 2' of inner pole ring 2 project into the area of the outer pole ring and are outwardly angled with their centering surfaces-equipped ends. Between arms 2', a slot 10 is located. The width of the slot is selected so that the axle 11 (see FIG. 2) of the movable part, and the inner part of frame 7, are insertable from the outside in arrow direction A into the inner space 12 of inner pole ring 2, and/or that the inner pole ring 2 with its slot 10 can be slid over the axle 11 and the inner part of frame 7.

Figure 3:
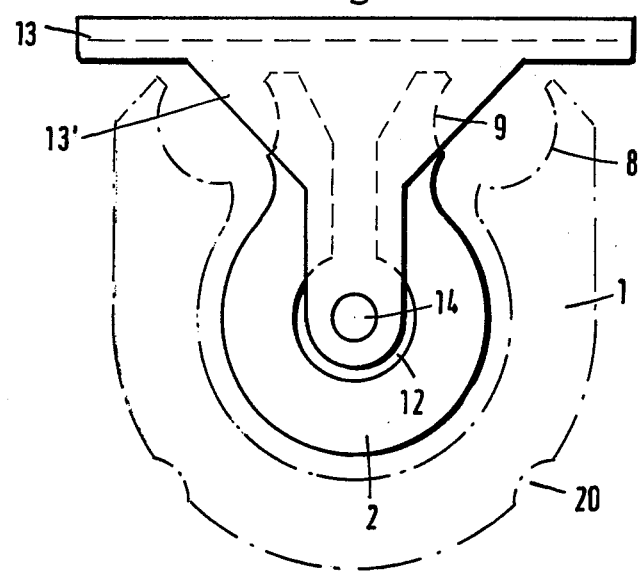
FIG. 3 illustrates a measuring mechanism according to FIGS. 1, 2 at an intermediate assembly stage.

The assembly is so arranged that the axle 11 together with frame 7, the measuring mechanism carrier 13, and axial bearings 14, as a unit is pre-assembled, counterbalanced and adjusted. Subsequently, the structural unit consisting of the above parts is brought to an intermediate assembly stage as shown in FIG. 3 by inserting it into slot 10, however, whereby the outer pole ring 1 and magnets 3 are not yet assembled. Subsequently in this example of embodiment, shown in FIG. 3, the outer pole ring 1 is axially slid from above over inner pole ring 2 into an intermediate position as indicated by dash-dot lines in FIG. 3, whereby the spacing between the ends of the outer pole ring is directed toward measuring mechanism carrier 13. Subsequently, in this embodiment both pole rings 1, 2 together are turned by 180° around axis 11 to the position as shown in FIG. 1.

It is obvious that with above explained embodiment of the assembly of the measuring mechanism, the outer pole ring 1 can be shifted to the position shown by dash-dot lines shown in FIG. 3 via upper carrier arm 13' of measuring mechanism carrier 13 only if the spacing between the ends of outer pole ring 1 somewhat exceeds the projection and/or contour of carrier arm 13'.

Following that, the magnets 3 are inserted and/or compressed between the pole ring areas 8, 9, so that both pole rings and both magnets are locked together. Finally, the outer pole ring is exactly positioned, and also the magnetic system with respect to the measuring mechanism, e.g., by means of alignment pins (not shown). For this purpose, both fastening screws 19 of the measuring mechanism carrier can be used, which screws project into recesses 20 of the outer pole ring. Fastening screws 19 fasten corner flanges 21 of the outer pole ring to the measuring mechanism carrier 13. It is understood that the above noted means of positioning can be inserted and/or screwed in only after the magnetic system already has been turned to the final position according to FIG. 1.

The above described locking of parts takes place at the centering surfaces 8, 9. Compressing these parts together in conjunction with the above explained positive locking insures a particularly flawless centering and mutual hold of magnetic system parts on each other without having to provide additional separate attachment means such as screws or the like for the mutual hold.

The cylindrical-circular magnets 3 each have a slot 15. The magnets themselves are magnetized according to the drawn-in dash-dot lines 16, that is, both magnets either are alternately in the horizontal or the vertical-drawn axis 16. Subsequently, they are rotated over slot 15 by means of a screwdriver so that the magnet directions run along the dotted lines 17. The torsional potential by means of slot 15 also allows for a certain correction of linearity. If, in special cases, a nonlinear instrument scale is desired, then the linearity can be adjusted asymmetrically by rotating one of the magnets.

According to the embodiment of FIG. 4, a centering (and also linearity and a mutual support of parts) can be accomplished by means of positive locking of centering areas so that the centering areas 8 of the outer pole ring ends, and the centering surfaces 9 of the inner pole ring arms are directly adjoined. Magnet 3' is developed in the shape of a semi-circular ring and abuts on the inner circumference of the outer pole ring. Between the magnet and the outer circumference of the inner pole ring an air gap 6 is again located. In this embodiment, a mutual compressing effect is produced between both pole rings along centering surfaces 8, 9, and between magnet 3' and outer pole ring along the area 18. Thus, by this embodiment, the use of any separate attachment means can be avoided by the mutual compression of pole rings and the magnet. The advantage of the embodiment according to FIG. 4 is that a very inexpensive material can be used for the magnets, namely, synthetic material-bonded magnets, which can be very economically manufactured in any given shape. A further provision is made that the cylindrically shaped magnet 3' is forced to assume any desired position in a circumferential direction by abutting the edges 3'' of magnet 3' on the angles 1' of the outer pole ring 1.

In most other respects (and specifically that concerning the assembly of parts) the discussion concerning FIGS. 1 and 2 also applies to the embodiment according to FIG. 4. The only difference is that here the outer pole ring together with the circular-shaped magnet 3' is slid over the inner pole ring 1, which coincides with the mutual compression of both pole rings.

It has been shown above that the objects of the invention have been met by providing a positive-locking arrangement of magnets or magnet and pole rings of a mutually effective type, so that the pole rings are mutually centered and fixed in this position in any direction. In this manner, each of both pole rings terminates in two arms or ends, between which a slot or spacing is arranged. The internal space of the inner pole ring used for carrying the axle or other elements of the movable part and part of its moving coil frame is accessible from the outside via the slot set between its arms or ends. The slot width is so dimensioned that the finished mount with its axle or other elements and corresponding frame part can be inserted through the slot in the internal space of the inner pole ring. One of the axial bearing-carrying arms of the mount-associated measuring mechanism carrier, preferably the upper assembly carrier arm, externally can be so dimensioned that its projection on the mount inserted magnetic system lies corresponding to the pivoting position of the external pole ring between the arms or ends of the pole ring.

This structure results in several advantages. The slot between the arms or ends of the inner pole ring and also the corresponding space between the arms or ends of the outer pole ring do not enter into the magnetic resistance of the magnetic system, because they do not lie in the magnetic circuit. The magnets or pole rings, which can be made of simple extruded or sintered parts, already achieve their required alignment, i.e., mutual concentric orientation, by their arrangement in a composite state. Thus, because the desired indicator linearity is produced, a calibration is no longer required. A screw coupling or bonding of parts can be relinquished. A dimensioning of the measuring mechanism carrier arm, performed after the inner pole ring is slid over the measuring mechanism axle or elements, and frame part, allows for sliding the outer pole ring over the inner pole ring.

Accordingly, what remains is to turn both pole rings into the definite operating position and, if required, to insert the magnets. This makes it feasible to mount, balance and adjust the mount consisting of bearing- and measuring mechanism carriers, and the movable part, i.e. the light-weight parts of the measuring mechanism, by themselves outside of the heavy pole rings and magnets. The assembly of the light parts is separated from the subsequent assembly of the heavy parts of the measuring mechanism. With the use of the invention, a substantially simpler and more accurate manufacture and assembly is accomplished, not only of the mount with rotary part, but also of the magnetic system and specifically related to the latter's mutual holding and centering of its parts.

According to a preferred embodiment as described above, the pole rings and the magnet, and/or the magnets are compressed or locked together and attached to each other by press fit. In this manner, an additional degree of economy and simplified assembly is accomplished simultaneously with an improved accuracy (concentricity) and a particularly strong hold of magnetic system components on each other. The danger of damaging sensitive axle and bearing has been substantially reduced.

The invention also is directed to a method for assembling the magnetic system of a wide-angle moving coil system with an associated mount having a movable part. For this purpose, the mount with movable part is itself first counterbalanced and adjusted in a pre-assembled state. Subsequently the mount with movable part is inserted into the inner pole ring. Then the outer pole ring is slide over it, both pole rings are turned. In any given case, the magnets are inserted, and the pole rings and/or pole rings and magnets together are compressed. This produces the advantages described above.

It should be understood that the invention encompasses moving coil instruments equipped with a measuring mechanism according to the invention. Such instruments typically include a housing, means for supplying an electrical parameter to be measured and a scale for displaying the measured parameter.

While the foregoing description and drawings represent the preferred embodiments of the present invention, it will be obvious to those skilled in the art that various changes and modifications may be made therein without departing from the true spirit and scope of the present invention.

It is possible to construct an embodiment wherein the axle 11 is replaced by two axle stubs which are not long enough to engage in the inner space 12.

What is claimed is:

1. A measuring mechanism for a wide-angle moving coil system comprising: a mount with movable part, an inner and outer pole ring, and at least one permanent magnet, said mechanism having an arrangement of magnet and pole rings wherein said magnet and pole rings are physically maintained in relative position solely by coacting forces resulting from contiguous and contacting surfaces of said magnet and pole rings so as to mutually lock said elements relative to one another, said pole rings being mutually centered and fixed in this position, each of the pole rings having two arms, between which a slot is arranged, said movable part having axle means and a moving coil frame, wherein, for holding at least part of its moving coil frame, an internal spacing of said inner pole ring is arranged, which spacing is accessible from outside of the mechanism via said slot located between its arms, said slot having a width which is dimensioned so that the pre-assembled mount with corresponding coil frame can be inserted into the internal spacing of the inner pole ring.

2. A measuring mechanism according to claim 1, wherein each of pole rings is a portion of a cylindrical ring, and wherein, between the outer circumference of the inner pole ring and the inner circumference of the outer pole ring, an air gap is provided for the rotation of said moving coil frame, said arms of said inner pole ring projecting into the area of the outer pole ring have centering surfaces, which surfaces interact with corresponding counter-centering surfaces of said arms of outer pole ring, said centering surfaces being so shaped as to insure fixing of pole rings in any direction.

3. A measuring mechanism according to claim 2, wherein space is provided between two interacting centering surfaces for the insertion of a magnet having corresponding a shape and dimensions, wherein the outer surfaces of the magnet are forced-locked to said centering surfaces.

4. A measuring mechanism according to claim 3, wherein said magnet is cylindrical and said centering surfaces are cylindrical.

5. A measuring mechanism according to claim 3 wherein the magnet is equipped with slots by means of which it is rotatable around its axis perpendicular to the direction of the magnet.

6. A measuring mechanism according to claim 2, wherein said centering surfaces of inner and outer pole rings directly abut each other and a circular-ring shaped magnet is provided in the air gap between inner and outer pole rings.

7. A measuring mechanism according to claim 1, wherein the pole rings and the magnet are compressed together and are attached to each other by a press fit.

8. A measuring mechanism according to claim 7, wherein the compression is carried out along the centering surfaces.

9. A measuring mechanism according to claim 1, wherein said magnet and pole rings are extruded.

10. A measuring mechanism according to claim 1, wherein said magnet and pole rings are sintered.

11. A measuring instrument for measuring an electrical parameter having the measuring mechanism of claim 1 and also including a housing, means for supplying an electrical parameter to said mechanism to be measured and a scale for displaying the measured parameter.

12. A measuring mechanism as claimed in claim 1 wherein said mechanism includes a mount-associated, mechanism carrier having at least one axial, bearing-held, carrier arm, said arm of said carrier being externally dimensioned so that its projection relative to a corresponding rotary position of said outer pole ring lies between the arms of said outer pole ring.

13. A measuring mechanism for a wide-angle moving coil system comprising:
an inner pole ring have an internal space;
an outer pole ring;
said pole rings being mutually centered and fixed in position and having an annular air gap therebetween;
said pole rings each having two arms and said inner pole ring having a slot between its arms;
said outer surfaces of the arms of said inner pole ring and the inner surfaces of the arms of said outer pole ring defining partially closed, geometrically-shaped spaces;

permanent magnets, each having a shape conforming to said geometrically-shaped space, being disposed in said spaces so as to physically lock and mutually fix said inner and outer pole rings relative to each other, said pole rings being mutually centered with respect to each other; and a mount with a movable part, said movable part having axle means and a movable coil frame, said internal spacing of said inner pole ring having disposed therein at least part of its movable coil frame, said slot between the arms of said inner pole ring being dimensioned so that the pre-assembled mount with said corresponding coil frame can be inserted into the internal spacing of the inner pole ring.

14. A measuring mechanism for a wide-angle moving coil system comprising:

an inner pole ring having an internal space;

an outer pole ring;

said pole rings being mutually centered and fixed in position and having an annular space therebetween;

said pole rings each having two arms and said inner pole ring having a slot between its arms, the end portions of said inner and corresponding outer arms forming a keying arrangement so as to physically lock and mutually fix said inner and outer pole rings relative to each other;

a permanent magnet adapted to conform to the shape of the inner surface of the outer pole ring and being disposed in the annular space between said pole rings so that an annular air gap remains between the inner surface of the magnet and the outer surface of the inner pole ring, said magnet being maintained in position by virtue of forces exerted by the mutual locking arrangement of inner and outer pole rings; and a mount with a movable part, said movable part having axle means and a movable coil frame, said internal spacing of said inner pole ring having disposed therein at least part of its movable coil frame, said slot between the arms of said inner pole ring being dimensioned so that the pre-assembled mount with said and corresponding coil frame can be inserted into the internal spacing of the inner pole ring.

15. The mechanism of claim 1, wherein an element of the movable part in addition to the coil frame is inserted into the internal spacing of the inner pole ring.

16. The mechanism of claims 14 or 15, wherein an element of the movable part in addition to the coil frame is inserted into the internal spacing of the inner pole ring.

* * * * *